United States Patent
Asadi et al.

(10) Patent No.: US 11,567,693 B2
(45) Date of Patent: Jan. 31, 2023

(54) PARAMETER ESTIMATION BASED ON PREVIOUS READ ATTEMPTS IN MEMORY DEVICES

(71) Applicant: SK hynix Inc., Icheon-si (KR)

(72) Inventors: Meysam Asadi, Fremont, CA (US); Aman Bhatia, San Jose, CA (US); Fan Zhang, Fremont, CA (US)

(73) Assignee: SK hynix Inc., Icheon-si (KR)

( * ) Notice: Subject to any disclaimer, the term of this patent is extended or adjusted under 35 U.S.C. 154(b) by 28 days.

(21) Appl. No.: 17/348,391

(22) Filed: Jun. 15, 2021

(65) Prior Publication Data

US 2022/0398031 A1   Dec. 15, 2022

(51) Int. Cl.
G06F 3/06 (2006.01)

(52) U.S. Cl.
CPC .......... *G06F 3/0655* (2013.01); *G06F 3/0619* (2013.01); *G06F 3/0679* (2013.01)

(58) Field of Classification Search
CPC ..... G06F 3/0655; G06F 3/0619; G06F 3/0679
See application file for complete search history.

(56) References Cited

U.S. PATENT DOCUMENTS

| | | | |
|---|---|---|---|
| 7,742,339 B2 | 6/2010 | Rizel et al. | |
| 10,158,380 B2 | 12/2018 | Sharon et al. | |
| 11,227,666 B1 * | 1/2022 | Parthasarathy | G11C 29/028 |
| 11,342,027 B1 * | 5/2022 | Asadi | G11C 16/30 |
| 2018/0159560 A1 * | 6/2018 | Sharon | H03M 13/1111 |
| 2022/0238168 A1 * | 7/2022 | Zhang | G06N 3/08 |

* cited by examiner

*Primary Examiner* — Hiep T Nguyen
(74) *Attorney, Agent, or Firm* — Perkins Coie LLP

(57) ABSTRACT

Devices, systems and methods for improving the performance of a memory device are described. An example method includes performing, based on a plurality of read voltages, read operations on each of a plurality of pages of a memory device, determining, based on the read operations for each page of the plurality of pages, a ones count in each page and a checksum of an error correcting code for each page, generating a first estimator for the checksum and a second estimator for the ones count based on a polynomial regression, determining, based on the first estimator and the second estimator, an updated plurality of read voltages, and applying the updated plurality of read voltages to the memory device to retrieve information from the memory device.

20 Claims, 12 Drawing Sheets

PARAMETER ESTIMATION BASED ON PREVIOUS READ ATTEMPTS IN MEMORY DEVICES

TECHNICAL FIELD

This patent document generally relates to memory devices, and more specifically, to robust and reliable access in memory devices.

BACKGROUND

Data integrity is important for data storage devices and data transmission. In solid state memory storage (such as NAND flash) devices, information is stored in a cell by different charge levels in a cell. During the write and read processes, noise is introduced by program disturb errors and inter-cell interference charge leakage that cause the voltage distribution and level to drop over time. Generating accurate read voltages improves the reliability and longevity of the memory storage devices.

SUMMARY

Embodiments of the disclosed technology relate to determining read voltages using parameter estimation based on previous read attempts, which improves performance of the memory device. These and other features and benefits are achieved at least in-part by using a polynomial regression to estimate a ones count and checksum, which are used to determine updated read voltages that are used for subsequent access to the memory device.

In an example aspect, a method for improving performance of a memory device is described. The method includes performing, based on a plurality of read voltages, read operations on each of a plurality of pages of a memory device, determining, based on the read operations for each page of the plurality of pages, a ones count in each page and a checksum of an error correcting code for each page, generating a first estimator for the checksum and a second estimator for the ones count based on a polynomial regression, determining, based on the first estimator and the second estimator, an updated plurality of read voltages, and applying the updated plurality of read voltages to the memory device to retrieve information from the memory device.

In yet another example aspect, the above-described method may be implemented by a memory controller that comprises, or is coupled to, a processor.

In yet another example aspect, these methods may be embodied in the form of processor-executable instructions and stored on a computer-readable program medium.

The subject matter described in this patent document can be implemented in specific ways that provide one or more of the following features.

DETAILED DESCRIPTION

Semiconductor memory devices may be volatile or non-volatile. The volatile semiconductor memory devices perform read and write operations at high speeds, while contents stored therein may be lost at power-off. The nonvolatile semiconductor memory devices may retain contents stored therein even at power-off. The nonvolatile semiconductor memory devices may be used to store contents, which must be retained regardless of whether they are powered.

With an increase in a need for a large-capacity memory device, a multi-level cell (MLC) or multi-bit memory device storing multi-bit data per cell is becoming more common. However, memory cells in an MLC non-volatile memory device must have threshold voltages corresponding to four or more discriminable data states in a limited voltage window. For improvement of data integrity in non-volatile memory devices, the levels and distributions of read voltages for discriminating the data states must be adjusted over the lifetime of the memory device to have optimal values during read operations and/or read attempts.

FIGS. 1-6 overview a non-volatile memory system (e.g., a flash-based memory, NAND flash) in which embodiments of the disclosed technology may be implemented.

Figure 1:
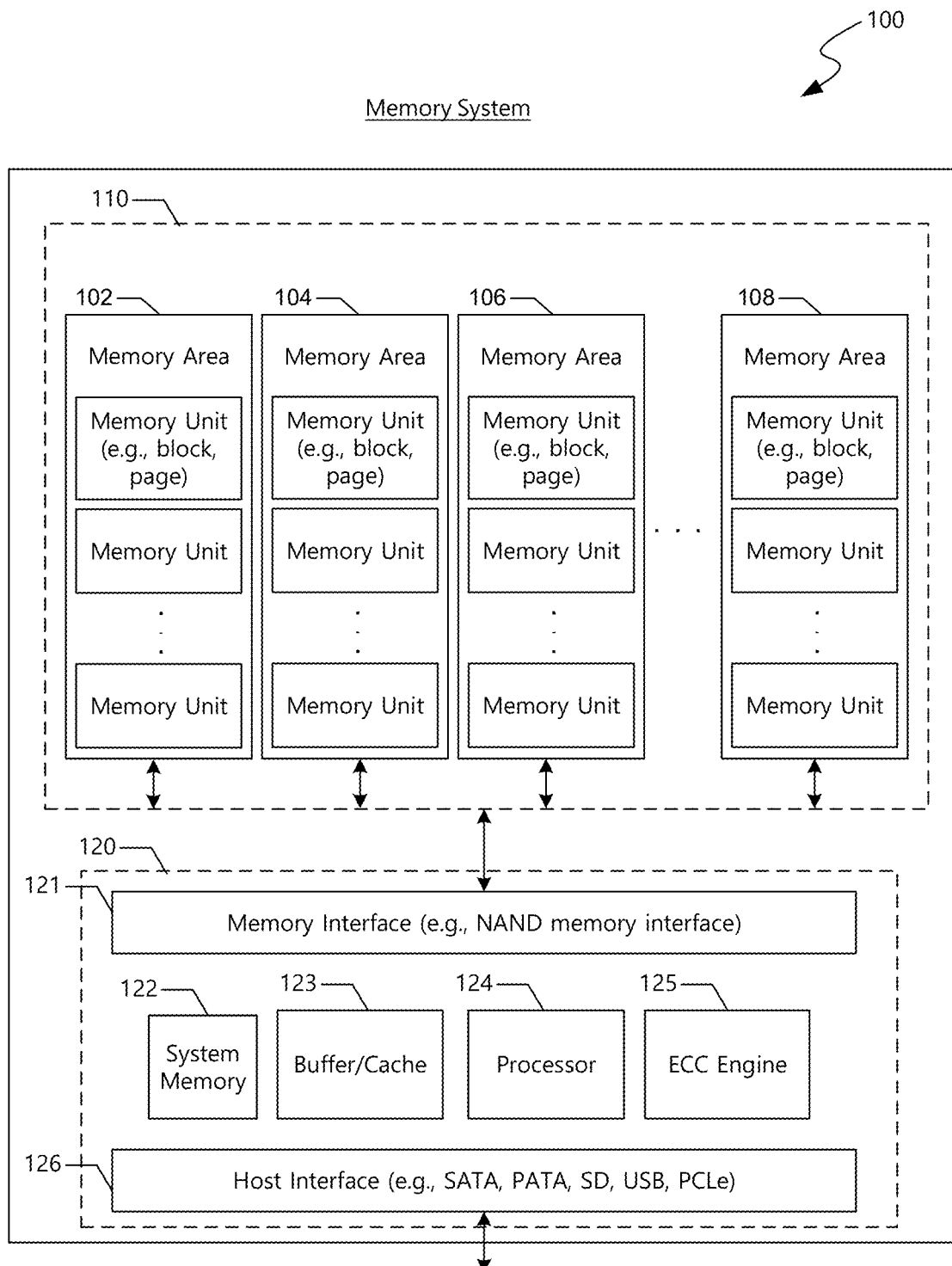
FIG. 1 illustrates an example of a memory system.

FIG. 1 is a block diagram of an example of a memory system 100 implemented based on some embodiments of the disclosed technology. The memory system 100 includes a memory module 110 that can be used to store information for use by other electronic devices or systems. The memory system 100 can be incorporated (e.g., located on a circuit board) in other electronic devices and systems. Alternatively, the memory system 100 can be implemented as an external storage device such as a USB flash drive and a solid-state drive (SSD).

The memory module 110 included in the memory system 100 can include memory areas (e.g., memory arrays) 102, 104, 106, and 108. Each of the memory areas 102, 104, 106, and 108 can be included in a single memory die or in multiple memory dice. The memory die can be included in an integrated circuit (IC) chip.

Each of the memory areas 102, 104, 106, and 108 includes a plurality of memory cells. Read, program, or erase operations can be performed on a memory unit basis. Thus, each memory unit can include a predetermined number of memory cells. The memory cells in a memory area 102, 104, 106, and 108 can be included in a single memory die or in multiple memory dice.

The memory cells in each of memory areas 102, 104, 106, and 108 can be arranged in rows and columns in the memory units. Each of the memory units can be a physical unit. For example, a group of a plurality of memory cells can form a memory unit. Each of the memory units can also be a logical unit. For example, the memory unit can be a block or a page that can be identified by a unique address such as a block address or a page address, respectively. For another example, wherein the memory areas 102, 104, 106, and 108 can include computer memories that include memory banks as a logical unit of data storage, the memory unit can be a bank that can be identified by a bank address. During a read or write operation, the unique address associated with a particular memory unit can be used to access that particular memory unit. Based on the unique address, information can be written to or retrieved from one or more memory cells in that particular memory unit.

The memory cells in the memory areas 102, 104, 106, and 108 can include non-volatile memory cells. Examples of non-volatile memory cells include flash memory cells, phase change random-access memory (PRAM) cells, magnetoresistive random-access memory (MRAM) cells, or other types of non-volatile memory cells. In an example implementation where the memory cells are configured as NAND flash memory cells, the read or write operation can be performed on a page basis. However, an erase operation in a NAND flash memory is performed on a block basis.

Each of the non-volatile memory cells can be configured as a single-level cell (SLC) or multiple-level memory cell. A single-level cell can store one bit of information per cell. A multiple-level memory cell can store more than one bit of information per cell. For example, each of the memory cells in the memory areas 102, 104, 106, and 108 can be configured as a multi-level cell (MLC) to store two bits of information per cell, a triple-level cell (TLC) to store three bits of information per cell, or a quad-level cells (QLC) to store four bits of information per cell. In another example, each of the memory cells in memory area 102, 104, 106, and 108 can be configured to store at least one bit of information (e.g., one bit of information or multiple bits of information), and each of the memory cells in memory area 102, 104, 106, and 108 can be configured to store more than one bit of information.

As shown in FIG. 1, the memory system 100 includes a controller module 120. The controller module 120 includes a memory interface 121 to communicate with the memory module 110, a host interface 126 to communicate with a host (not shown), a processor 124 to execute firmware-level code, and caches and memories 123 and 122, respectively to temporarily or persistently store executable firmware/instructions and associated information. In some implementations, the controller unit 120 can include an error correction engine 125 to perform error correction operation on information stored in the memory module 110. Error correction engine 125 can be configured to detect/correct single bit error or multiple bit errors. In another implementation, error correction engine 125 can be located in the memory module 110.

The host can be a device or a system that includes one or more processors that operate to retrieve data from the memory system 100 or store or write data into the memory system 100. In some implementations, examples of the host can include a personal computer (PC), a portable digital device, a digital camera, a digital multimedia player, a television, and a wireless communication device.

In some implementations, the controller module 120 can also include a host interface 126 to communicate with the host. Host interface 126 can include components that comply with at least one of host interface specifications, including but not limited to, Serial Advanced Technology Attachment (SATA), Serial Attached Small Computer System Interface (SAS) specification, Peripheral Component Interconnect Express (PCIe).

Figure 2:
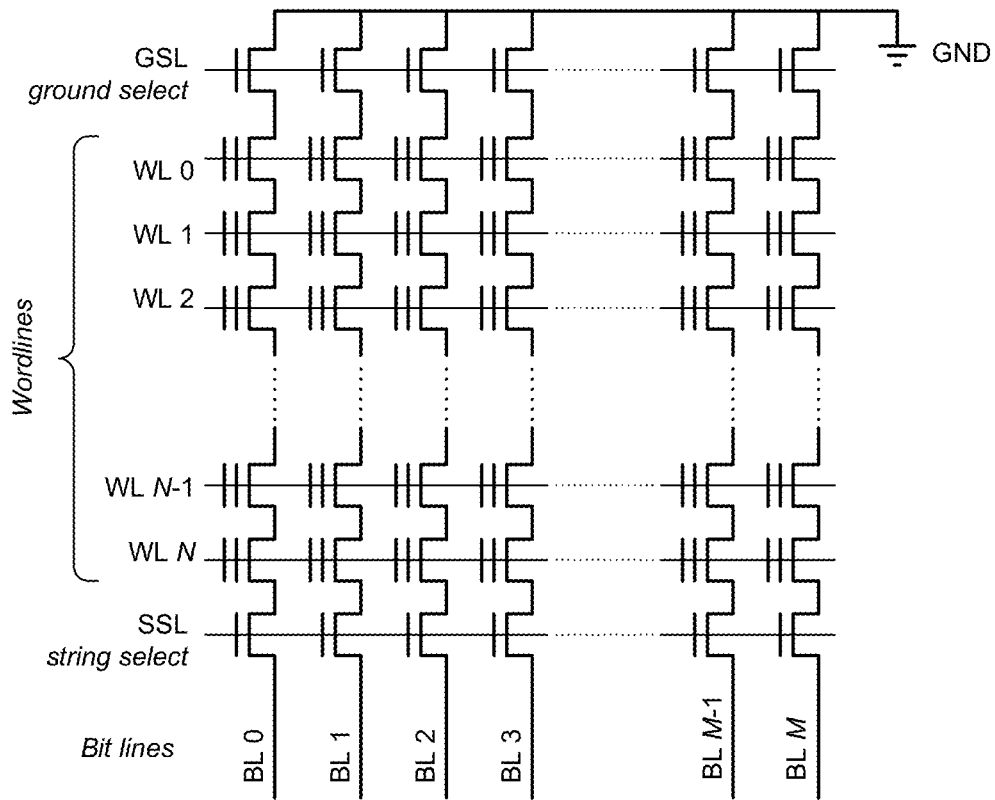
FIG. 2 is an illustration of an example non-volatile memory device.

FIG. 2 illustrates an example of a memory cell array implemented based on some embodiments of the disclosed technology.

In some implementations, the memory cell array can include NAND flash memory array that is partitioned into many blocks, and each block contains a certain number of pages. Each block includes a plurality of memory cell strings, and each memory cell string includes a plurality of memory cells.

In some implementations where the memory cell array is NAND flash memory array, read and write (program) operations are performed on a page basis, and erase operations are performed on a block basis. All the memory cells within the same block must be erased at the same time before performing a program operation on any page included in the block. In an implementation, NAND flash memories may use an even/odd bit-line structure. In another implementation, NAND flash memories may use an all-bit-line structure. In the even/odd bit-line structure, even and odd bit-lines are interleaved along each word-line and are alternatively accessed so that each pair of even and odd bit-lines can share peripheral circuits such as page buffers. In all-bit-line structure, all the bit-lines are accessed at the same time.

Figure 3:
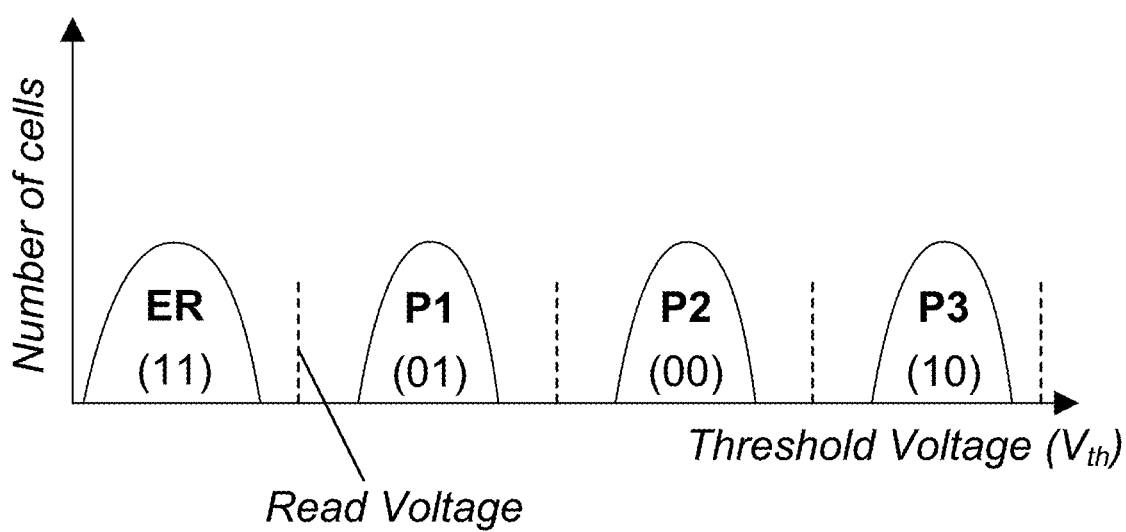
FIG. 3 is an example diagram illustrating the cell voltage level distribution ($V_{th}$) of a non-volatile memory device.

FIG. 3 illustrates an example of threshold voltage distribution curves in a multi-level cell device, wherein the number of cells for each program/erase state is plotted as a function of the threshold voltage. As illustrated therein, the threshold voltage distribution curves include the erase state (denoted "ER" and corresponding to "11") with the lowest threshold voltage, and three program states (denoted "P1", "P2" and "P3" corresponding to "01", "00" and "10", respectively) with read voltages in between the states (denoted by the dotted lines). In some embodiments, each of the threshold voltage distributions of program/erase states has a finite width because of differences in material properties across the memory array.

Although FIG. 3 shows a multi-level cell device by way of example, each of the memory cells can be configured to store any number of bits per cell. In some implementations, each of the memory cells can be configured as a single-level cell (SLC) to store one bit of information per cell, or as a triple-level cell (TLC) to store three bits of information per cell, or as a quad-level cells (QLC) to store four bits of information per cell.

In writing more than one data bit in a memory cell, fine placement of the threshold voltage levels of memory cells is needed because of the reduced distance between adjacent distributions. This is achieved by using incremental step pulse program (ISPP), i.e., memory cells on the same word-line are repeatedly programmed using a program-and-verify approach with a stair case program voltage applied to word-lines. Each programmed state associates with a verify voltage that is used in verify operations and sets the target position of each threshold voltage distribution window.

Read errors can be caused by distorted or overlapped threshold voltage distribution. An ideal memory cell threshold voltage distribution can be significantly distorted or overlapped due to, e.g., program and erase (P/E) cycle, cell-to-cell interference, and data retention errors, which will be discussed in the following, and such read errors may be managed in most situations by using error correction codes (ECC).

Figure 4:
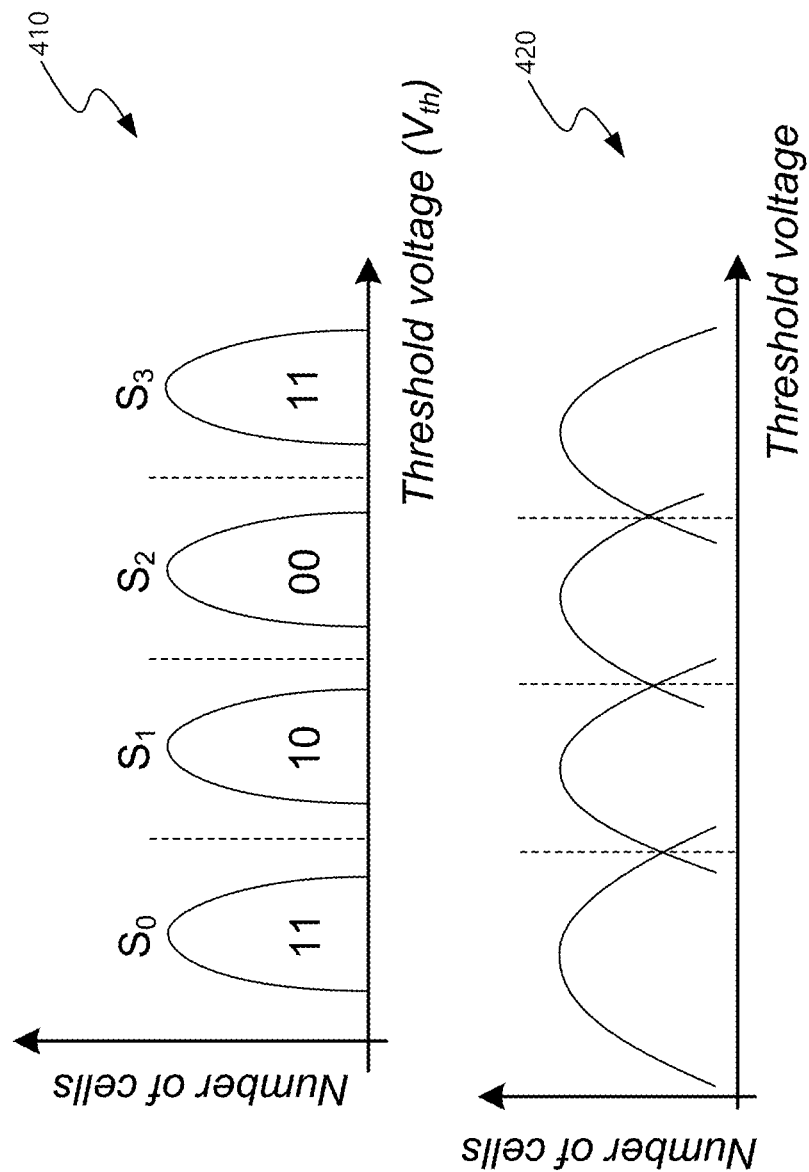
FIG. 4 is another example diagram illustrating the cell voltage level distribution ($V_{th}$) of a non-volatile memory device.

FIG. 4 illustrates an example of ideal threshold voltage distribution curves 410 and an example of distorted threshold voltage distribution curves 420. The vertical axis indicates the number of memory cells that has a particular threshold voltage represented on the horizontal axis.

For n-bit multi-level cell NAND flash memory, the threshold voltage of each cell can be programmed to $2^n$ possible values. In an ideal multi-level cell NAND flash memory, each value corresponds to a non-overlapping threshold voltage window.

Flash memory P/E cycling causes damage to a tunnel oxide of floating gate of a charge trapping layer of cell transistors, which results in threshold voltage shift and thus gradually degrades memory device noise margin. As P/E cycles increase, the margin between neighboring distributions of different programmed states decreases and eventually the distributions start overlapping. The data bit stored in a memory cell with a threshold voltage programmed in the overlapping range of the neighboring distributions may be misjudged as a value other than the original targeted value.

Figure 5:
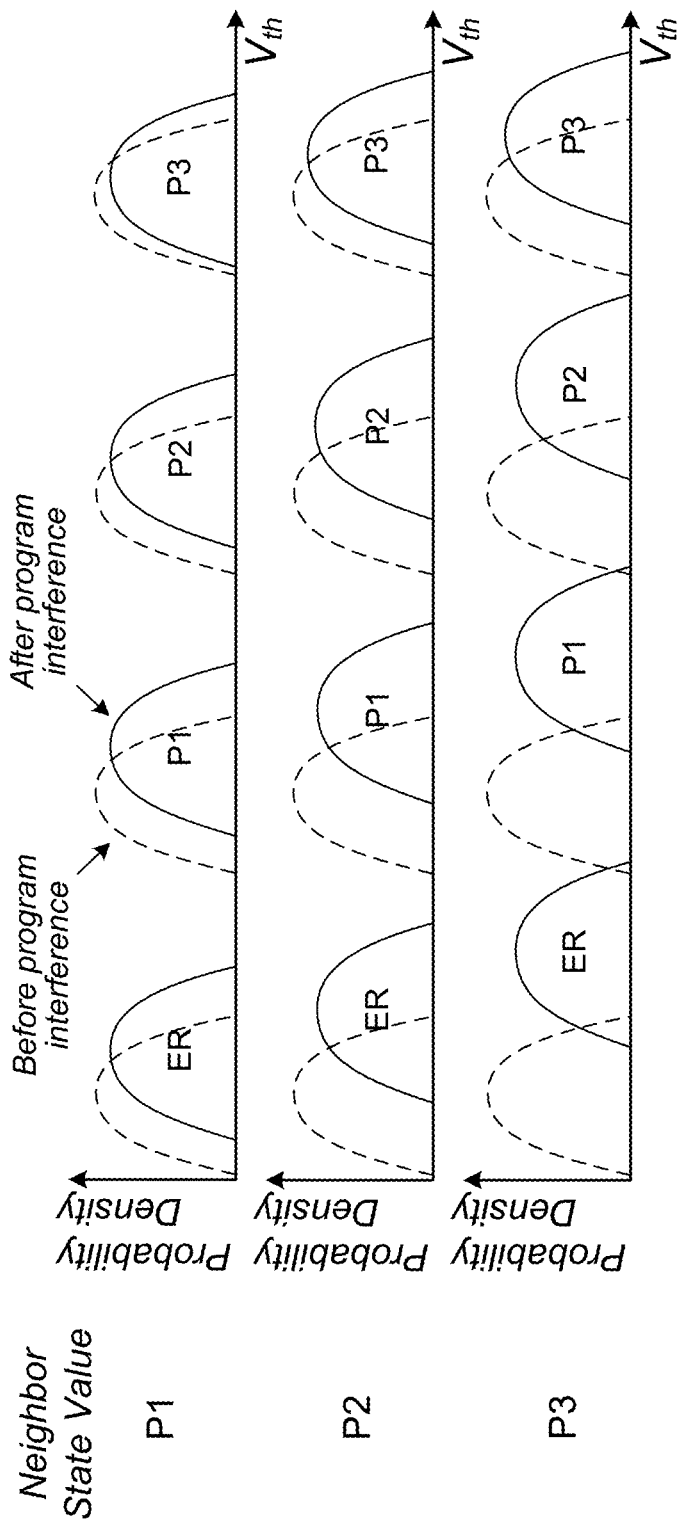
FIG. 5 is an example diagram illustrating the cell voltage level distribution ($V_{th}$) of a non-volatile memory device before and after program interference.

FIG. 5 illustrates an example of a cell-to-cell interference in NAND flash memory. The cell-to-cell interference can also cause threshold voltages of flash cells to be distorted. The threshold voltage shift of one memory cell transistor can influence the threshold voltage of its adjacent memory cell transistor through parasitic capacitance-coupling effect between the interfering cell and the victim cell. The amount of the cell-to-cell interference may be affected by NAND flash memory bit-line structure. In the even/odd bit-line structure, memory cells on one word-line are alternatively connected to even and odd bit-lines and even cells are programmed ahead of odd cells in the same word-line. Therefore, even cells and odd cells experience different amount of cell-to-cell interference. Cells in all-bit-line structure suffer less cell-to-cell interference than even cells in the even/odd bit-line structure, and the all-bit-line structure can effectively support high-speed current sensing to improve the memory read and verify speed.

The dotted lines in FIG. 5 denote the nominal distributions of P/E states (before program interference) of the cells under consideration, and the "neighbor state value" denotes the value that the neighboring state has been programmed to. As illustrated in FIG. 5, if the neighboring state is programmed to P1, the threshold voltage distributions of the cells under consideration shift by a specific amount. However, if the neighboring state is programmed to P2, which has a higher threshold voltage than P1, that results in a greater shift compared to the neighboring state being P1. Similarly, the shift in the threshold voltage distributions is greatest when the neighboring state is programmed to P3.

Figure 6:
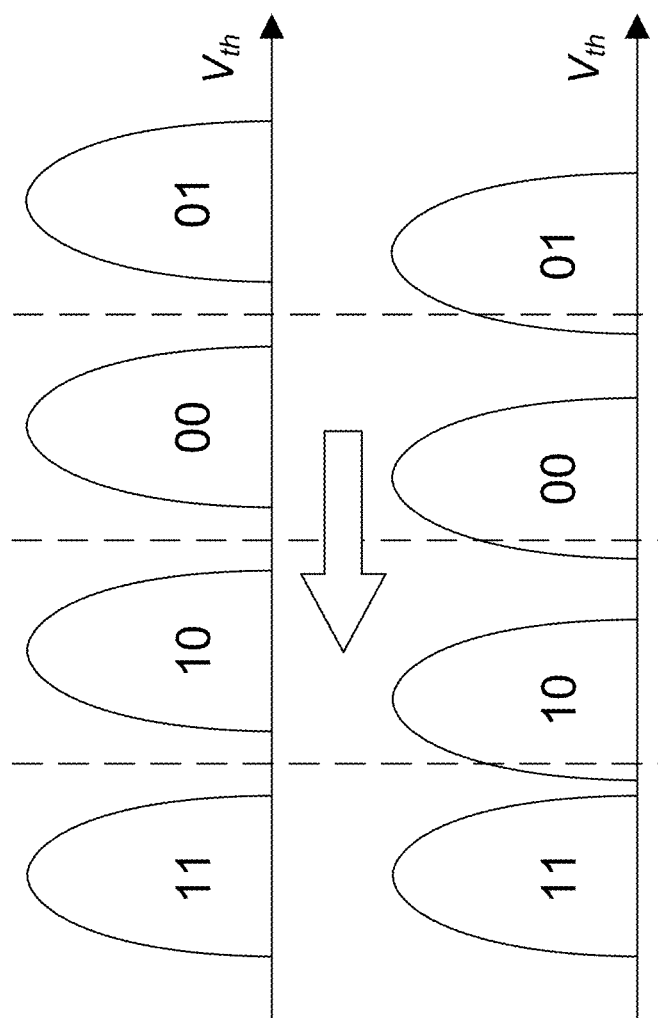
FIG. 6 is an example diagram illustrating the cell voltage level distribution ($V_{th}$) of a non-volatile memory device as a function of the reference voltage.

FIG. 6 illustrates an example of a retention error in NAND flash memory by comparing normal threshold-voltage distribution and shifted threshold-voltage distribution. The data stored in NAND flash memories tend to get corrupted over time and this is known as a data retention error. Retention errors are caused by loss of charge stored in the floating gate or charge trap layer of the cell transistor. Due to wear of the floating gate or charge trap layer, memory cells with more program erase cycles are more likely to experience retention errors. In the example of FIG. 6, comparing the top row of voltage distributions (before corruption) and the bottom row of distributions (contaminated by retention error) reveals a shift to the left.

In NAND-based storage systems (e.g., the examples illustrated in FIGS. 1-6), performing a single page read is a long latency process (~60 us for a TLC page). Since the cell-level distribution for each page is unknown, placing read voltages far from the optimal read thresholds could lead to high BER, and subsequent decoding failures. To efficiently handle the read placement, extracting information from the previous failed read attempts can reduce the total number of reads required for successful decoding and consequently the latency of the host-read operation.

In existing systems, a page is read again when decoding is not successful. However, the threshold voltages for the subsequent read attempt are selected independently from all previous read attempts, which does not leverage any information learned therefrom. Thus, methods to capture useful information from previous reads advantageously reduce the number of read attempts and increase the probability of successful decoding in subsequent read attempts.

Embodiments of the disclosed technology use a polynomial regression technique to obtain a checksum estimator and a ones-count estimator. The proposed estimators do not make any assumption on the cell-level distribution and do not depend on the NAND generation. They can be used in conjunction with any failed-read attempts and only utilize information from previous read attempts. Firmware can be configured to use these estimators to derive more accurate read thresholds for subsequent read attempts of any page, thereby drastically improving quality-of-service (QoS) by reducing the number of failed read attempts.

In some embodiments, useful meta-information is extracted from read attempts even if that information is not decodable by the ECC decoder. This meta-information is represented as an estimator that can guide the search for next read-attempt for this page, or pro-actively predict failures of history-read for other pages in the block/die that have similar cell-level distributions.

Figure 7A:
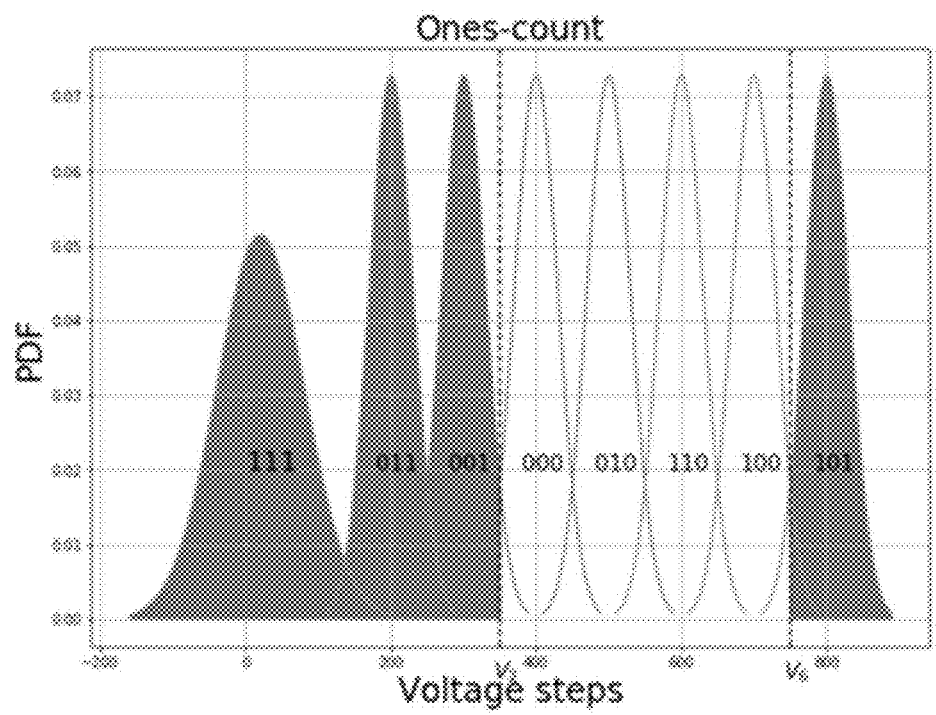
FIGS. 7A and 7B illustrate examples of the ones count and bit error rate (BER) in a triple-level cell (TLC) cell-level distribution, respectively.
Figure 7B:
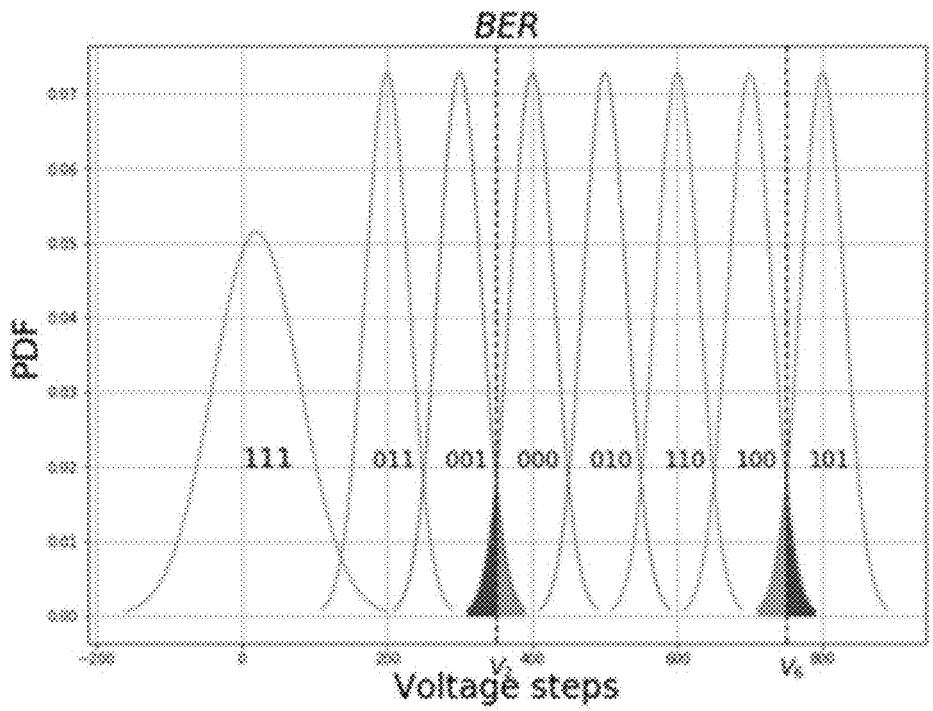

FIGS. 7A and 7B illustrate the examples of the read parameters associated with reading an LSB page in the TLC. FIG. 7A illustrates the distributions corresponding to a one in the LSB as dark-shaded distributions (for states "111", "011", "001" and "101") and the distributions corresponding to a zero (for states "000", "010", "110" and "100") as a function of the voltage steps. FIG. 7B illustrates the corresponding regions that may result in a BER, i.e., the overlap between the distributions corresponding to states "001" and "000" and the overlap between the distributions corresponding to states "100" and "101".

For each LSB page read attempt, the following information can be observed and utilized for an improved read-threshold search:

Threshold $(v_2, v_6)$;

Ones count: When data is scrambled before writing on the TLC page, the one's count is expected to be close to half the page-size. The fraction of ones in the page is denoted as $P_1$ and the nominal value of $P_1$ is expected to be equal to 0.5 (representing equal distributions of zeros and ones on the page); and LDPC checksum (CS): The checksum of a low-density parity check (LDPC) code is the initial syndrome weight and provides a noisy estimate of the BER of the page.

Although the embodiments are described for an LSB page in a TLC NAND device, it can be appreciated that these methods and techniques are applicable to other page types and other NAND-Flash types. As discussed above, the checksum and ones count estimators can be used to derive more accurate read thresholds for subsequent read attempts of any page, thereby reducing the number of failed read attempts and improving quality-of-service (QoS).

In some embodiments, the estimator can also be used to adjust the incremental step pulse programming (ISPP) parameters in the NAND-Flash device. ISPP is an approach for programming memory states in MLC and SLC transistors. In an ISPP operation, a program voltage is applied to the control gate of a selected memory cell using short successive program pulses of increasing magnitude. Between each pulse of increased magnitude, a program verify operation is performed to check whether each of the selected memory cell has a threshold voltage that has risen above a program verify voltage level for that memory cell. The ISPP operation continues until the threshold voltage of each of the selected memory cells (e.g., the memory cells illustrated in FIGS. 1-2) rises above the corresponding program verify voltage so that the threshold voltage of each of the cells represents a desired memory state.

Figure 8A:
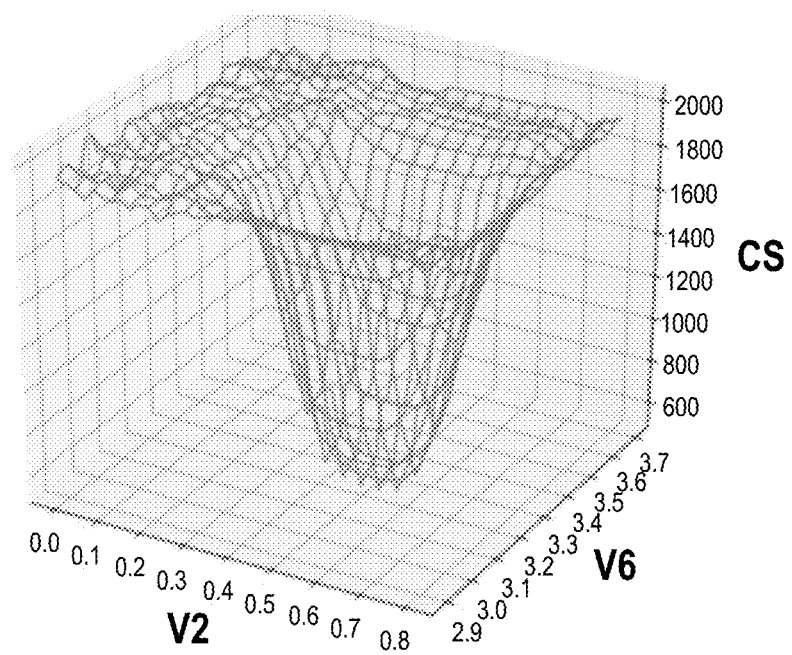
FIGS. 8A and 8B illustrate examples of a surface plot and a contour plot for the checksum, respectively, corresponding to a NAND LSB page.
Figure 8B:
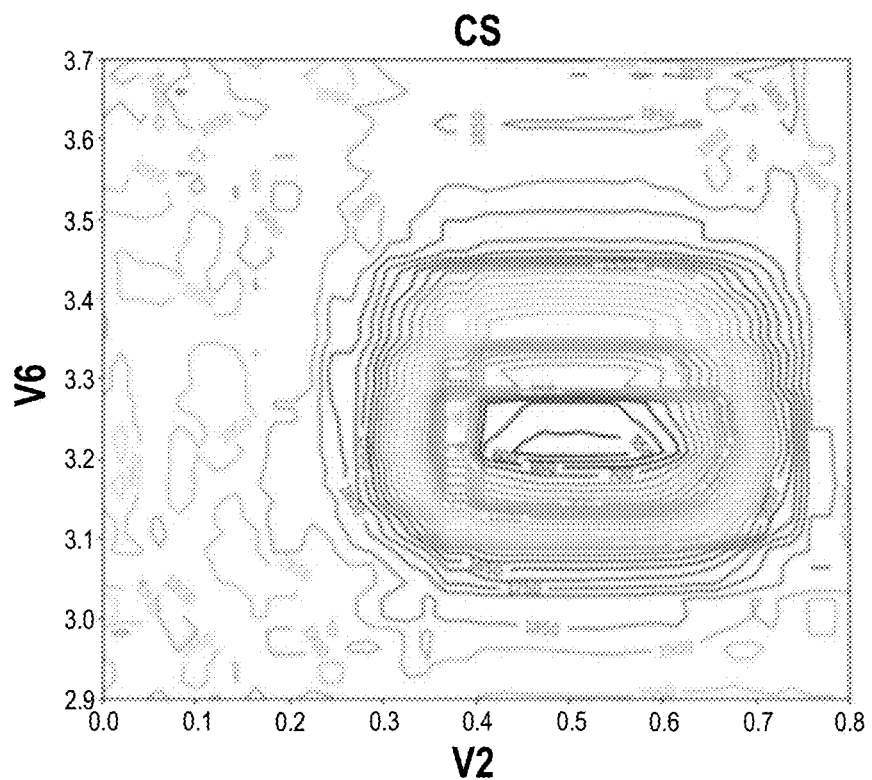

Embodiments of the disclosed technology describe an estimator for the LDPC checksum, which is the initial syndrome weight and provides a noisy estimate of the BER of the page. FIGS. 8A and 8B illustrate a surface plot and a contour plot, respectively, for the value of the checksum for a typical LSB page (with 21000 program/erase cycles) for varying LSB read thresholds.

In some embodiments, to estimate the CS surface shown in FIG. 7A, two regions are considered: (1) the region close to the minimum value of the CS surface, which can be well approximated by a degree $d_{cs}$ polynomial, and (2) the region far from the optimal (or near optimal) read threshold, which is saturated to a maximum value of the checksum, denoted $CS_{max}$. Given these two regions, the following model can be used to estimate the checksum:

$$\widehat{CS} = CS_{max} \times S(\theta_0 + \theta_1 v_2 + \ldots + \theta_{d_{cs}} v_2^{d_{cs}} + \theta_{d_{cs}+1} v_6 + \ldots \theta_{2d_{cs}} v_6^{d_{cs}}) \quad \text{Eq. (1)}$$

Herein, $S(\cdot)$ denotes the sigmoid function, and the checksum estimator ($\widehat{CS}$) is the product of the maximum (saturation) value of the checksum ($CS_{max}$) and a sum of N des-degree polynomials corresponding to N read voltages of the plurality of read voltages. In this example, for the LSB page, N=2 corresponding to $v_2$ and $v_6$ (as illustrated in FIG. 7A). In an example, the sigmoid function may be a logistic function, a hyperbolic tangent function, an arctangent function, an error function, or a generalized logistic function.

Let $$invs_{CS} \triangleq S^{-1}\left(\frac{\widehat{CS}}{CS_{max}}\right),$$

wherein $S^{-1}$ is the inverse sigmoid function that can be computed using arithmetic units or lookup tables (LUTs). In an example, the precision of the LUTs and the inverse sigmoid function may be based on the available hardware or complexity constraints. Given this notation, Equation (1) can be simplified to $$\theta_0 + \theta_1 v_2 + \ldots + \theta_{d_{cs}} v_2^{d_{cs}} + \theta_{d_{cs}+1} v_6 + \ldots + \theta_{2d_{cs}} v_6^{d_{cs}} = invs_{cs}.$$

Let $(v_2^{(i)}, v_6^{(i)})$ denote the i-th previous read, $CS^{(i)}$ be the corresponding checksum, and m denote the number of previous reads. The information generated from the m previous reads can be used to construct matrices V and Y, which are defined as:

$$V = \begin{bmatrix} 1 & v_2^{(1)} & v_6^{(1)} & v_2^{(1)2} & v_6^{(1)2} & \ldots & v_2^{(1)d_{cs}} & v_6^{(1)d_{cs}} \\ 1 & v_2^{(2)} & v_6^{(2)} & v_2^{(2)2} & v_6^{(2)2} & \ldots & v_2^{(2)d_{cs}} & v_6^{(2)d_{cs}} \\ \vdots & \vdots & \vdots & \vdots & \vdots & \ddots & \vdots & \vdots \\ 1 & v_2^{(m)} & v_6^{(m)} & v_2^{(m)2} & v_6^{(m)2} & \ldots & v_2^{(m)d_{cs}} & v_6^{(m)d_{cs}} \end{bmatrix} \text{ and}$$

$$Y = \begin{bmatrix} invs_{CS}^{(1)} \\ invs_{CS}^{(2)} \\ \vdots \\ invs_{CS}^{(m)} \end{bmatrix}.$$

The number of previous reads can be selected such that $m \geq 2d_{cs}+1$, and the first parameter set $\Theta = [\theta_0, \theta_1, \ldots, \theta_{2d_{cs}}]$ for this first estimator can be determined using a linear least squares model, using:

$$\Theta = (V^T V)^{-1} \cdot V^T Y.$$

Figure 9A:
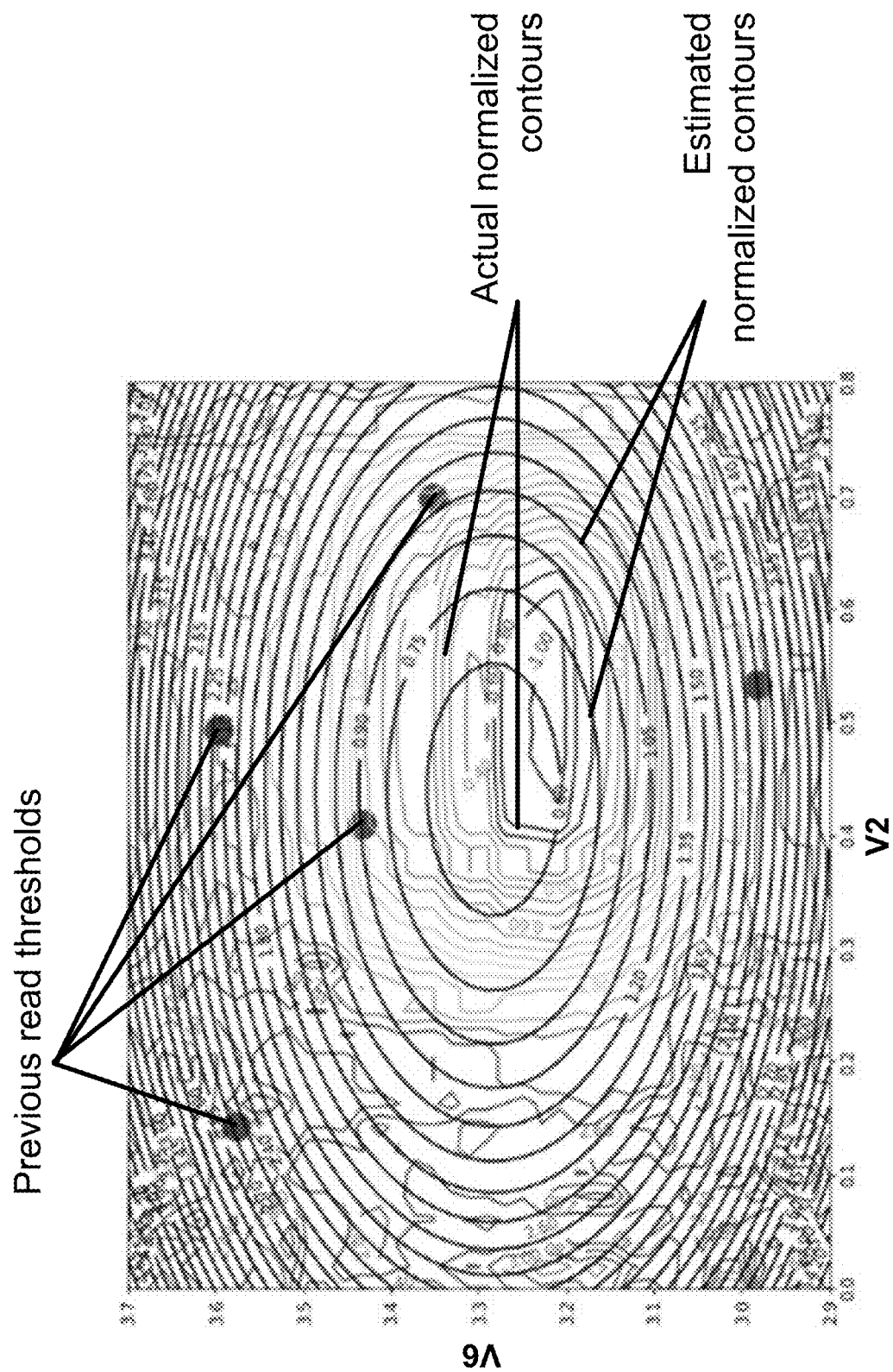
FIG. 9A illustrates an example of the normalized contour plots for a checksum estimator with a polynomial of degree two ($d_{cs}=2$) using five reads ($m=5$).

FIG. 9A illustrates an example of the underlying checksum contour plots of an LSB page (labeled as "actual normalized contours"). Using information obtained from m=5 previous reads (denoted as solid dots) and a CS estimator of degree $d_{cs}=2$, an estimate of the checksum surface can be derived (labeled as "estimated normalized contours"), which are shown as black ellipses superimposed on the underlying contours in FIG. 9A. It is noted that using information from a higher number of read attempts along with a higher degree estimator typically leads to more accurate estimation of the checksum surface, albeit at the cost of increased computation and complexity.

Figure 9B:
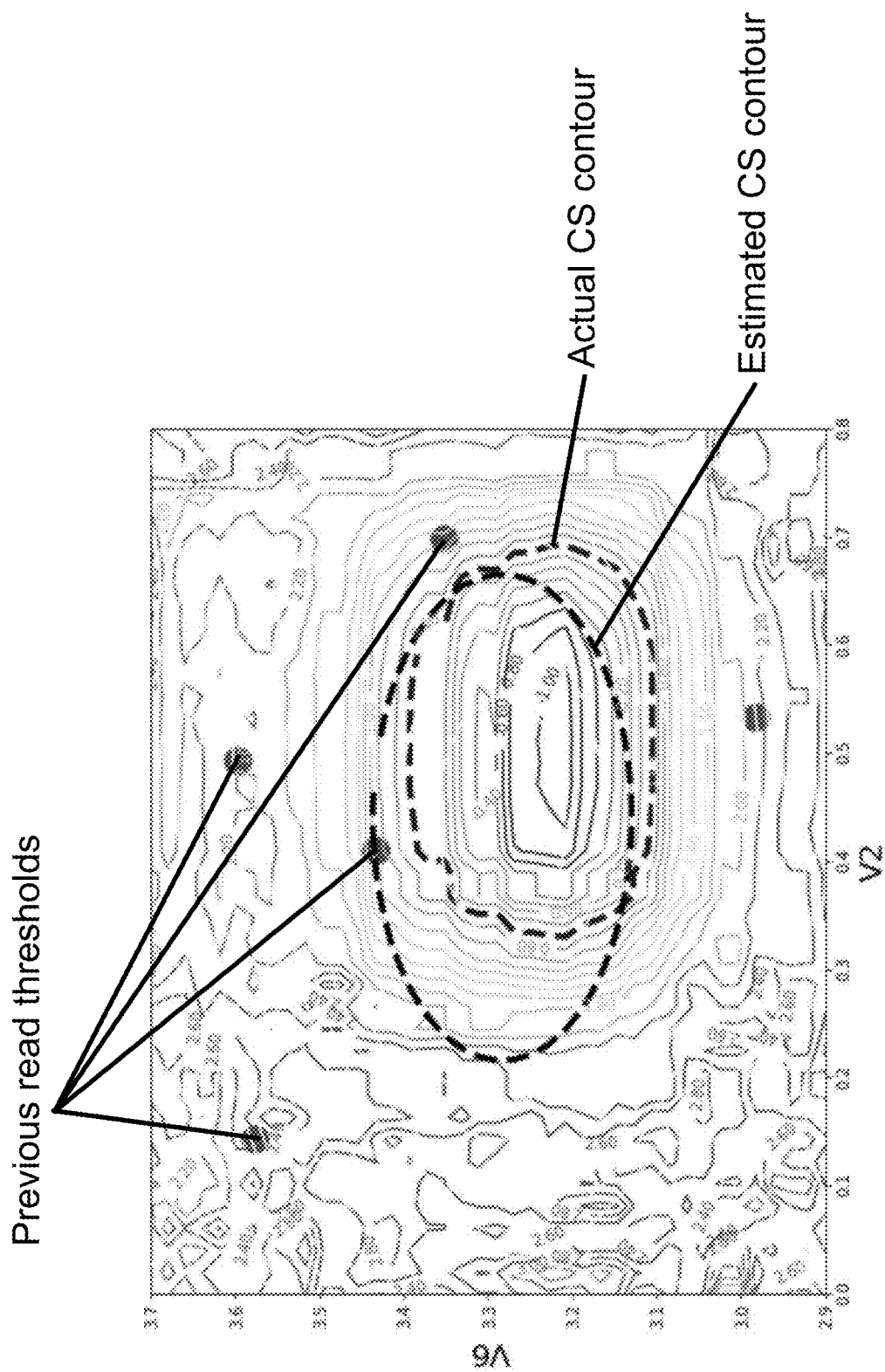
FIG. 9B illustrates an example of successful read thresholds corresponding to a specific checksum value for the example shown in FIG. 9A.

Although the shapes of actual and estimated contours are different in FIG. 9A, what is relevant is any difference that might exist in the correctable region. The correctable region includes all read thresholds that provide a bit error rate (BER) that can be corrected by the error correction code (ECC). For the checksum estimation, it is assumed that all read thresholds with CS less than a predetermined value can be corrected by the ECC decoder. In an example, the threshold value of the CS depends on the ECC code and the associated decoder. FIG. 9B shows the actual and estimated contours, and previous reads, for a specific CS value (e.g., CS=1000). As shown therein, the actual CS region and the estimated CS region overlap fairly well.

The checksum estimator based on previous reads, and derived using polynomial regression, provides meta-information, which cannot be used for decoding, but can be leveraged to improve subsequent read thresholds based on the described embodiments.

Figure 10A:
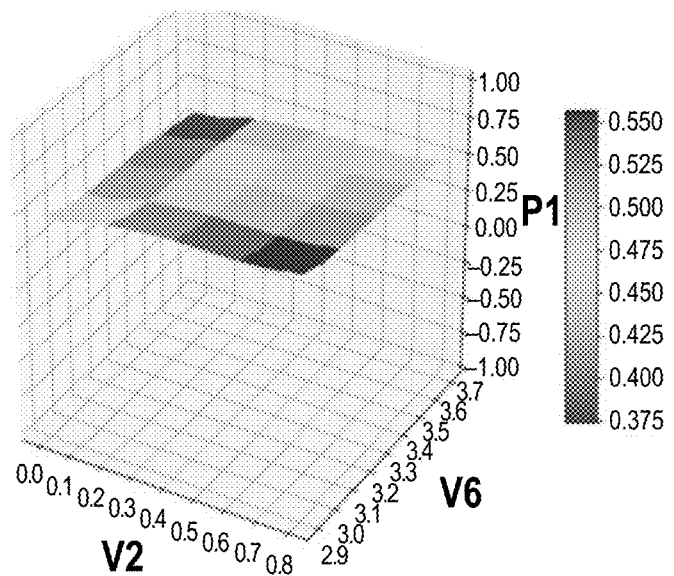
FIGS. 10A and 10B illustrate examples of a surface plot and a contour plot for the ones count, respectively, corresponding to a NAND page.
Figure 10B:
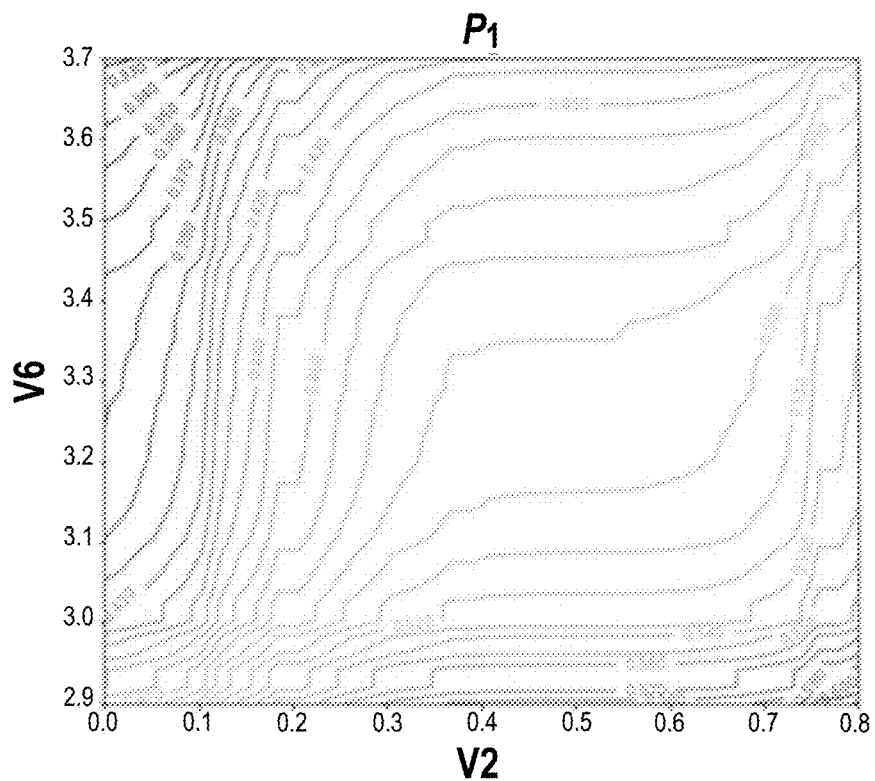

Embodiments of the disclosed technology further described an estimator for the ones count (denoted $P_1$), which is fraction of ones in a page that has a nominal value of 0.5. FIGS. 10A and 10B illustrate a surface plot and a contour plot, respectively, for the ones count for a typical LSB page (with 21000 program/erase cycles) for varying LSB read thresholds.

As shown in FIG. 10B, the contour lines corresponding to the $P_1$ surface (shown in FIG. 10A) are polynomial, and the following model is used to estimate probability of the ones count:

$$\hat{P}_1 = S(\phi_0 + \phi_1 v_2 + \ldots + \phi_{d_p} v_2^{d_p} + \phi_{d_p+1} v_6 + \ldots + \phi_{2d_p} v_6^{d_p}). \quad \text{Eq. (2)}$$

Herein, S(•) denotes the sigmoid function, and the ones count estimator ($\hat{P}_1$) is the sum of N $d_p$-degree polynomials corresponding to N read voltages of the plurality of read voltages. In this example, for the LSB page, N=2 corresponding to $v_2$ and $v_6$ (as illustrated in FIG. 7A). In an example, the sigmoid function may be a logistic function, a hyperbolic tangent function, an arctangent function, an error function, or a generalized logistic function.

Let $$invs_{CS} \triangleq S^{-1}\left(\frac{\overline{CS}}{CS_{max}}\right),$$

wherein $S^{-1}$ is the inverse sigmoid function that can be computed using arithmetic units or lookup tables (LUTs). In an example, the precision of the LUTs and the inverse sigmoid function may be based on the available hardware or complexity constraints. Given this notation, Equation (2) can be simplified to $$\phi_0 + \phi_1 v_2 + \ldots + \phi_{d_p} v_2^{d_p} + \phi_{d_p+1} v_6 + \ldots + \phi_{2d_p} v_6^{d_p} = invs_{P_1}.$$

Let ($v_2^{(i)}$, $v_6^{(i)}$) denote the i-th previous read, $P_1^{(i)}$ be the corresponding percentage of ones, and m denote the number of previous reads. The information generated from the m previous reads can be used to construct matrices W and Z, which are defined as:

$$W = \begin{bmatrix} 1 & v_2^{(1)} & v_6^{(1)} & v_2^{(1)2} & v_6^{(1)2} & \ldots & v_2^{(1)d_p} & v_6^{(1)d_p} \\ 1 & v_2^{(2)} & v_6^{(2)} & v_2^{(2)2} & v_6^{(2)2} & \ldots & v_2^{(2)d_p} & v_6^{(2)d_p} \\ \vdots & \vdots & \vdots & \vdots & \vdots & \ddots & \vdots & \vdots \\ 1 & v_2^{(m)} & v_6^{(m)} & v_2^{(m)2} & v_6^{(m)2} & \ldots & v_2^{(m)d_p} & v_6^{(m)d_p} \end{bmatrix} \text{ and}$$

$$Z = \begin{bmatrix} invs_{P_1}^{(1)} \\ invs_{CS}^{(2)} \\ \vdots \\ invs_{CS}^{(m)} \end{bmatrix}.$$

The number of previous reads can be selected such that m≥2$d_p$, and the second parameter set $\Phi=[\phi_0, \phi_1, \ldots, \phi_{2d_p}]$ for this second estimator can be determined using a linear least squares model, using:

$$\Phi = (W^T W)^{-1} \cdot W^T Z$$

Figure 11:
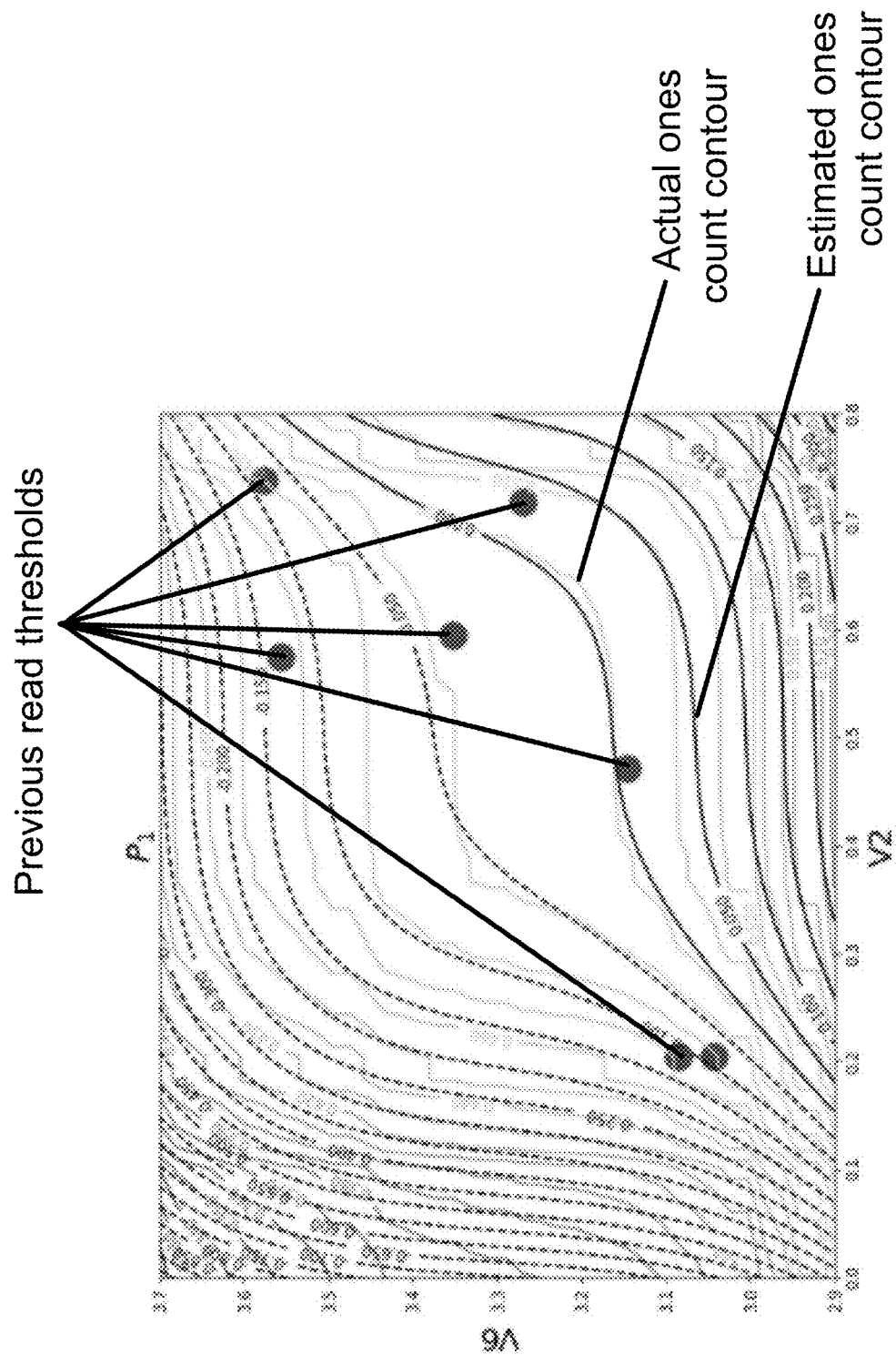
FIG. 11 illustrates an example of the ones count estimator with a polynomial of degree three ($d_p=3$) using seven reads ($m=7$).

FIG. 11 shows the underlying $P_1$ contour plots of a LSB page (labeled as "actual ones count contour"). Using information obtained from m=7 previous reads (denoted as solid dots) and a $P_1$ estimator of degree $d_p$=3, an estimate of the $P_1$ surface can be derived (labeled "estimated ones count contour"), which are shown as black lines superimposed on the underlying contours in FIG. 11. Using the estimated contour lines, the threshold region that corresponds to the ones count ($P_1$) being close to 50% can be determined.

The ones count estimator based on previous reads, and derived using polynomial regression, provides meta-information, which cannot be used for decoding, but can be leveraged to improve subsequent readthresholds based on the described embodiments.

In some embodiments, the firmware can be configured to applying a function of the sets of estimated parameters (Θ and Φ) to determine the updated read voltages (e.g., $v_2$ and $v_6$). In an example, the function is the average of the corresponding parameter estimates. In another example, the function is a weighted average of the corresponding parameter estimates, wherein the weights are determined based on simulation performance and/or previously collected data.

Figure 12:
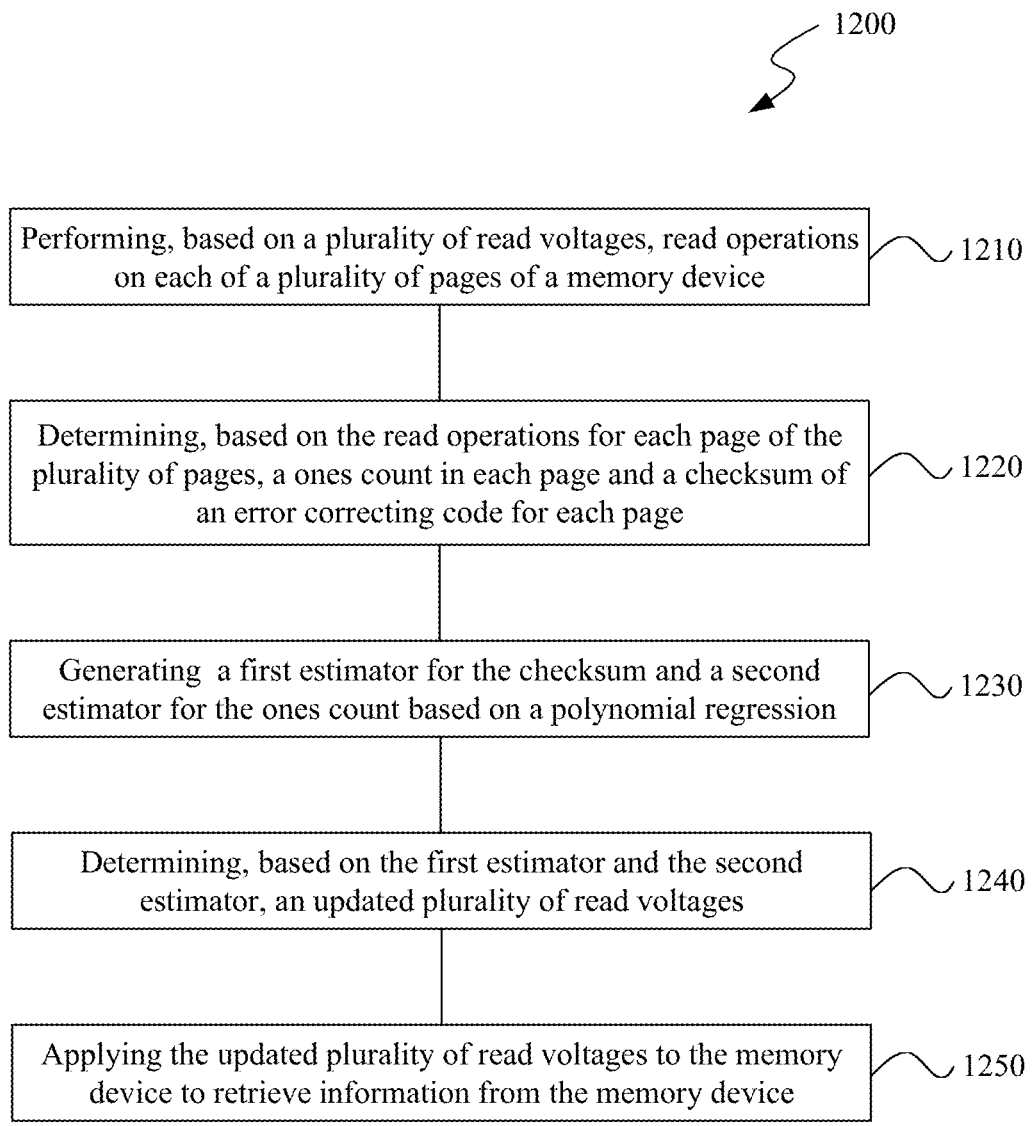
FIG. 12 illustrates a flowchart of an example method for improving the performance of a memory device.

FIG. 12 illustrates a flowchart of a method 1200 for improving performance of a memory device. The method 1200 includes, at operation 1210, performing, based on a plurality of read voltages, read operations on each of a plurality of pages of a memory device.

The method 1200 includes, at operation 1220, determining, based on the read operations for each page of the plurality of pages, a ones count in each page and a checksum of an error correcting code for each page.

The method 1200 includes, at operation 1230, generating a first estimator for the checksum and a second estimator for the ones count based on a polynomial regression.

The method 1200 includes, at operation 1240, determining, based on the first estimator and the second estimator, an updated plurality of read voltages.

The method 1200 includes, at operation 1250, applying the updated plurality of read voltages to the memory device to retrieve information from the memory device.

In some embodiments, the first estimator for the checksum comprises a product of a maximum value of the checksum and a sigmoid function of a sum of N $d_{cs}$-degree polynomials corresponding to N read voltages of the plurality of read voltages, N and $d_{cs}$ are positive integers, and coefficients of the N $d_{cs}$-degree polynomials comprise a first parameter set.

In some embodiments, the method 1200 further includes the operations of generating, for each of the read operations and based on an inverse of the sigmoid function, a set of m polynomials, wherein m is a positive integer corresponding to a number of the read operations, and wherein m≥2$d_{cs}$+1, and applying a linear least squares model to the set of m polynomials to generate an estimate of the first parameter set.

In some embodiments, the second estimator for the ones count comprises a sigmoid function of a sum of N $d_p$-degree polynomials corresponding to N read voltages of the plurality of read voltages, N and $d_p$ are positive integers, and coefficients of the N $d_p$-degree polynomials comprise a second parameter set.

In some embodiments, the method 1200 further includes the operations of generating, for each of the read operations and based on an inverse of the sigmoid function, a set of m polynomials, wherein m is a positive integer corresponding to a number of the read operations, and wherein m≥2$d_p$, and applying a linear least squares model to the set of m polynomials to generate an estimate of the second parameter set.

In some embodiments, the sigmoid function is selected from the group consisting of a logistic function, a hyperbolic tangent function, an arctangent function, an error function, and a generalized logistic function.

In some embodiments, the inverse of the sigmoid function is determined using a lookup table (LUT).

In some embodiments, the first estimator and the second estimator are used to adjust one or more incremental step pulse programming (ISPP) parameters in the memory device.

In some embodiments, the memory device comprises a plurality of cells, and wherein generating the first estimator and the second estimator is independent of a voltage distribution of the plurality of cells.

In some embodiments, the updated plurality of read voltages is based on a weighted average of the estimate of the first parameter set and the estimate of the second parameter set.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing unit" or "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of non-volatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed is:

1. A method for improving performance of a memory device, comprising:
    performing, based on a plurality of read voltages, read operations on each of a plurality of pages of a memory device;
    determining, based on the read operations for each page of the plurality of pages, a ones count in each page and a checksum of an error correcting code for each page;
    generating a first estimator for the checksum and a second estimator for the ones count based on a polynomial regression;
    determining, based on the first estimator and the second estimator, an updated plurality of read voltages; and
    applying the updated plurality of read voltages to the memory device to retrieve information from the memory device.

2. The method of claim 1, wherein the first estimator for the checksum comprises a product of a maximum value of the checksum and a sigmoid function of a sum of N $d_{cs}$-degree polynomials corresponding to N read voltages of the plurality of read voltages, wherein N and $d_{cs}$ are positive integers, and wherein coefficients of the N $d_{cs}$-degree polynomials comprise a first parameter set.

3. The method of claim 2, wherein the sigmoid function is selected from the group consisting of a logistic function, a hyperbolic tangent function, an arctangent function, an error function, and a generalized logistic function.

4. The method of claim 2, further comprising:
generating, for each of the read operations and based on an inverse of the sigmoid function, a set of m polynomials, wherein m is a positive integer corresponding to a number of the read operations, and wherein $m \geq 2d_{cs}+1$; and
applying a linear least squares model to the set of m polynomials to generate an estimate of the first parameter set.

5. The method of claim 4, wherein the inverse of the sigmoid function is determined using a lookup table (LUT).

6. The method of claim 1, wherein the second estimator for the ones count comprises a sigmoid function of a sum of N $d_p$-degree polynomials corresponding to N read voltages of the plurality of read voltages, wherein N and $d_p$ are positive integers, and wherein coefficients of the N $d_p$-degree polynomials comprise a second parameter set.

7. The method of claim 6, wherein the sigmoid function is selected from the group consisting of a logistic function, a hyperbolic tangent function, an arctangent function, an error function, and a generalized logistic function.

8. The method of claim 6, further comprising:
generating, for each of the read operations and based on an inverse of the sigmoid function, a set of m polynomials, wherein m is a positive integer corresponding to a number of the read operations, and wherein $m \geq 2d_p$; and
applying a linear least squares model to the set of m polynomials to generate an estimate of the second parameter set.

9. The method of claim 8, wherein the inverse of the sigmoid function is determined using a lookup table (LUT).

10. The method of claim 1, wherein the first estimator and the second estimator are used to adjust one or more incremental step pulse programming (ISPP) parameters in the memory device.

11. The method of claim 1, wherein the memory device comprises a plurality of cells, and wherein generating the first estimator and the second estimator is independent of a voltage distribution of the plurality of cells.

12. A system for improving performance of a memory device, comprising:
a processor and a memory including instructions stored thereupon, wherein the instructions upon execution by the processor cause the processor to:
perform, based on a plurality of read voltages, read operations on each of a plurality of pages of a memory device;
determine, based on the read operations for each page of the plurality of pages, a ones count in each page and a checksum of an error correcting code for each page;
generate a first estimator for the checksum and a second estimator for the ones count based on a polynomial regression;
determine, based on the first estimator and the second estimator, an updated plurality of read voltages; and
apply the updated plurality of read voltages to the memory device to retrieve information from the memory device.

13. The system of claim 12, wherein the first estimator for the checksum comprises a product of a maximum value of the checksum and a sigmoid function of a sum of N $d_{cs}$-degree polynomials corresponding to N read voltages of the plurality of read voltages, wherein N and $d_{cs}$ are positive integers, and wherein coefficients of the N $d_{cs}$-degree polynomials comprise a first parameter set.

14. The system of claim 13, wherein the instructions upon execution by the processor further cause the processor to:
generate, for each of the read operations and based on an inverse of the sigmoid function, a set of m polynomials, wherein m is a positive integer corresponding to a number of the read operations, and wherein $m \geq 2d_{cs}+1$; and
apply a linear least squares model to the set of m polynomials to generate an estimate of the first parameter set.

15. The system of claim 12, wherein the second estimator for the ones count comprises a sigmoid function of a sum of N $d_p$-degree polynomials corresponding to N read voltages of the plurality of read voltages, wherein N and $d_p$ are positive integers, and wherein coefficients of the N $d_p$-degree polynomials comprise a second parameter set.

16. The system of claim 15, wherein the instructions upon execution by the processor further cause the processor to:
generate, for each of the read operations and based on an inverse of the sigmoid function, a set of m polynomials, wherein m is a positive integer corresponding to a number of the read operations, and wherein $m \geq 2d_p$; and
apply a linear least squares model to the set of m polynomials to generate an estimate of the second parameter set.

17. A non-transitory computer-readable storage medium having instructions stored thereupon for improving performance of a memory device, comprising:
instructions for performing, based on a plurality of read voltages, read operations on each of a plurality of pages of a memory device;
instructions for determining, based on the read operations for each page of the plurality of pages, a ones count in each page and a checksum of an error correcting code for each page;
instructions for generating a first estimator for the checksum and a second estimator for the ones count based on a polynomial regression;
instructions for determining, based on the first estimator and the second estimator, an updated plurality of read voltages; and
instructions for applying the updated plurality of read voltages to the memory device to retrieve information from the memory device.

18. The computer-readable storage medium of claim 17, wherein the first estimator for the checksum comprises a product of a maximum value of the checksum and a sigmoid function of a sum of N $d_{cs}$-degree polynomials corresponding to N read voltages of the plurality of read voltages, wherein N and $d_{cs}$ are positive integers, wherein coefficients of the N $d_{cs}$-degree polynomials comprise a first parameter set, and wherein the computer-readable storage medium further comprises:
instructions for generating, for each of the read operations and based on an inverse of the sigmoid function, a set of m polynomials, wherein m is a positive integer corresponding to a number of the read operations, and wherein $m \geq 2d_{cs}+1$; and
instructions for applying a linear least squares model to the set of m polynomials to generate an estimate of the first parameter set.

19. The computer-readable storage medium of claim 18, wherein the second estimator for the ones count comprises a sigmoid function of a sum of N $d_p$-degree polynomials corresponding to N read voltages of the plurality of read voltages, wherein N and $d_p$ are positive integers, wherein coefficients of the N $d_p$-degree polynomials comprise a second parameter set, and wherein the computer-readable storage medium further comprises:

instructions for generating, for each of the read operations and based on an inverse of the sigmoid function, a set of m polynomials, wherein m is a positive integer corresponding to a number of the read operations, and wherein $m \geq 2d_p$; and instructions for applying a linear least squares model to the set of m polynomials to generate an estimate of the second parameter set.

20. The computer-readable storage medium of claim 19, wherein the updated plurality of read voltages is based on a weighted average of the estimate of the first parameter set and the estimate of the second parameter set.

* * * * *